United States Patent

Yasuda

[19]

[11] Patent Number: 5,925,093
[45] Date of Patent: Jul. 20, 1999

[54] SAMPLING FREQUENCY CONVERTING APPARATUS

[75] Inventor: Nobuyuki Yasuda, Chiba, Japan

[73] Assignee: Sony Corporation, Tokyo, Japan

[21] Appl. No.: 08/946,379

[22] Filed: Oct. 7, 1997

Related U.S. Application Data

[30] Foreign Application Priority Data

Oct. 15, 1996 [JP] Japan .................................... 8-272489

[51] Int. Cl.$^6$ ...................................................... G06F 17/17
[52] U.S. Cl. .......................... 708/313; 708/290; 702/197
[58] Field of Search ................................ 364/724.1, 723; 702/197; 341/61, 123

[56] References Cited

U.S. PATENT DOCUMENTS

| | | | |
|---|---|---|---|
| 4,630,034 | 12/1986 | Takahashi | 341/61 X |
| 4,748,578 | 5/1988 | Lagadec et al. | 364/724.1 |
| 4,797,845 | 1/1989 | Stikvoort | 364/724.1 |
| 5,159,338 | 10/1992 | Takahashi | 341/61 |
| 5,365,468 | 11/1994 | Kakubo et al. | 708/313 |
| 5,398,029 | 3/1995 | Toyama et al. | 341/61 |
| 5,475,628 | 12/1995 | Adams et al. | 364/724.1 |
| 5,481,267 | 1/1996 | Miyabe et al. | 341/61 |

*Primary Examiner*—Hassan Kizou
*Assistant Examiner*—Douglas S. Lee
*Attorney, Agent, or Firm*—Jay H. Maioli

[57] ABSTRACT

A sampling frequency converting apparatus according to present invention is such an apparatus in which, when a first digital signal of a sampling frequency Fsi is converted into a second digital signal of an arbitrary sampling frequency Fso by using a digital filter, the ratio between the sampling frequency Fsi and the sampling frequency Fso is obtained and this input/output sampling frequency ratio is utilized as a control amount for the sampling frequency conversion. The sampling frequency converting apparatus includes a buffer memory for temporarily storing the first digital signal, an operating unit for performing an interpolation processing with respect to the input/output sampling frequency ratio at every regular time and a calculating unit which calculates a read address of the buffer memory on the basis of the input/output sampling frequency ratio interpolated by the operating unit.

6 Claims, 8 Drawing Sheets

26 Ring Buffer

SAMPLING FREQUENCY CONVERTING APPARATUS

BACKGROUND OF THE INVENTION

1. Field of the Invention

The present invention relates to a sampling frequency converting apparatus for converting an input digital signal sampled with a predetermined sampling frequency into a digital signal of a sampling frequency which is asynchronous with the above predetermined sampling frequency, and particularly to an apparatus which is capable of preventing a deterioration of a converting accuracy resulting from a change of a ratio between an input sampling frequency and an output sampling frequency.

2. Description of the Related Art

In a digital equipment represented by a digital audio apparatus and a digital video tape apparatus, when transmitting and receiving data between equipments having different sampling frequencies, it is necessary to convert a sampling frequency of data output from a transmitting side equipment into a sampling frequency of a receiving side equipment.

In the sampling frequency converting apparatus as described above, in general, a ratio between an input sampling frequency and an output sampling frequency (input/output sampling frequency ratio) is measured and a frequency conversion processing is performed using this input/output sampling frequency ratio.

FIG. 1 is a diagram showing a schematic system configuration of a sampling frequency converting apparatus. An input/output sampling frequency ratio measuring and generating circuit 1 receives as its inputs an input signal system reference clock (for example, a clock 128 Fsi of a frequency 128 times an input sampling frequency Fsi) supplied from a transmitting side digital equipment through an input terminal Pi1 as well as an output signal system reference clock (a clock of a frequency a predetermined number time an output sampling frequency Fso) supplied from a receiving side digital equipment through an input terminal Pi2.

As is shown in FIG. 2, the input/output sampling frequency ratio measuring and generating circuit 1 includes a Fsi/Fso counter circuit 3 which receives the input signal system reference clock 128 Fsi input from the input terminal Pi1 and a frequency divider 4 which divides the output sampling frequency Fso supplied through the input terminal Pi2 into a predetermined number of parts (by way of an example, 1/4096) and supplies it to the Fsi/Fso counter circuit 3. The Fsi/Fso counter circuit 3 includes a counter 5 for counting the input signal system reference clock 128 Fsi (by way of an example, a free run counter of 19 bits word length) and a latch circuit 6 to which the counter output is input. An output clock 1/4096 Fso from the frequency divider 4 is supplied to the counter 5 as a reset pulse and also to the latch circuit 6 as a strobe pulse. Therefore, a ratio between the input sampling period and the output sampling period is latched in the latch circuit 6 in the form of count value of the input signal system reference clock 128 FSi at every period of the clock 1/4096 Fso (i.e. at every time corresponding to 4096 clock amount of the output sampling frequency Fso).

This count value increases as the input sampling frequency Fsi becomes higher than the output sampling frequency Fso, whereas it decreases as the input sampling frequency Fsi becomes lower than the output sampling frequency Fso. The count value corresponds to a ratio between the two sampling frequencies Fsi and Fso in each period of the clock 1/4096 Fso. Accordingly, by measuring the ratio between the input sampling period and the output sampling period, the input/output sampling frequency ratio can be found.

In order to improve its accuracy by increasing the number of digits of the measured value of the input/output sampling frequency ratio, a measuring period T of the count value of the input signal system reference clock 128 Fsi is set to be the time period for 4096 clock amount of the output sampling frequency Fso rather than the time period for one clock amount thereof.

An output of the latch circuit 6 (the measured value RS of the input/output sampling frequency ratio) is supplied to a sampling frequency converter signal processor 2 of FIG. 1 through an output terminal Po2. The sampling frequency converter signal processor 2 frequency-converts a digital signal of the input sampling frequency Fsi supplied from the transmitting side digital equipment through an input terminal Pi3 using the measured value RS of the input/output sampling frequency ratio, and supplies a digital signal of the output sampling frequency Fso to the receiving side digital equipment through an output terminal Po1.

In this manner, the conventional sampling frequency converting apparatus used to perform the frequency conversion processing using the measured value RS itself of the input/output sampling frequency ratio found by the input/output sampling frequency ratio measuring and generating circuit 1.

Incidentally, when the input sampling frequency Fsi in the transmitting side (or the output sampling frequency Fso in the receiving side) changes in the middle of the conversion processing of the sampling frequency, the measured value RS of the input/output sampling frequency ratio found by the input/output sampling frequency ratio measuring and generating circuit 1 goes to a value which changes rapidly stepwise between the successive measuring periods T of the input/output sampling frequency ratio, for example, as is shown in FIG. 3. In such a case, with the conventional sampling frequency converting apparatus, since the measured value RS of the input/output sampling frequency ratio is utilized as is for performing the frequency conversion processing, a temporal wave distortion is generated on the output digital signal, which may result in the deterioration of the frequency converting accuracy.

It has been attempted that, in such a case, the measured value RS of the input/output sampling frequency ratio is integrated and the integrated value for reducing the change is supplied to the sampling frequency converter signal processor 2. However, while it is required of the sampling frequency converting apparatus to convert the sampling frequency of the input digital signal in real time, since it will take a considerably long period of time to sufficiently reduce the change by the integration, a substantial time delay will be produced until the integrated measured value of the input/output sampling frequency ratio is supplied to the sampling frequency converter signal processor 2 according to the attempted method. Therefore, the attempted method is not suitable for applying to the sampling frequency converting apparatus.

SUMMARY OF THE INVENTION

In view of such aspects, it is an object of the present invention to provide a sampling frequency converting apparatus which is capable of preventing the deterioration of the frequency converting accuracy resulting from the variation of the measured value RS of the input/output sampling frequency ratio without comprising the real-time requirement.

The sampling frequency converting apparatus according to present invention is characterized in that, in the sampling frequency converting apparatus in which, when converting a first digital signal of the sampling frequency Fsi into a second digital signal of an arbitrary sampling frequency Fso, the ratio between the sampling frequency Fsi and the sampling frequency Fso is found and this input/output sampling frequency ratio is utilized as a control amount for the sampling frequency conversion, the apparatus comprises a buffer memory for temporarily storing the first digital signal, operating means for performing an interpolation processing with respect to the input/output sampling frequency ratio at every regular time interval and calculating means which calculates a read address of the buffer memory on the basis of the input/output sampling frequency ratio which is interpolated by the operating means.

According to the present sampling frequency converting apparatus, by interpolating the input/output sampling frequency ratio at every regular time interval through the operating means, the rapid change of the input/output sampling frequency ratio is lowered sufficiently. On the basis of the input/output sampling frequency ratio whose change is sufficiently reduced, various signal processings for the frequency conversion, such as the calculation of the read address of the buffer memory by the calculating means and so on are performed. Consequently, it is possible to acquire the output digital signal which includes no temporal wave distortion resulting from the rapid change of the original input/output sampling frequency ratio value.

In addition, a period of time required for sufficiently reducing the change by that interpolation is much shorter as compared with the time required for sufficiently reducing the change by the integration. Therefore, the real-time requirement for the conversion processing in the sampling frequency converting apparatus can adequately be satisfied.

DESCRIPTION OF THE PREFERRED EMBODIMENTS

Figure 1:
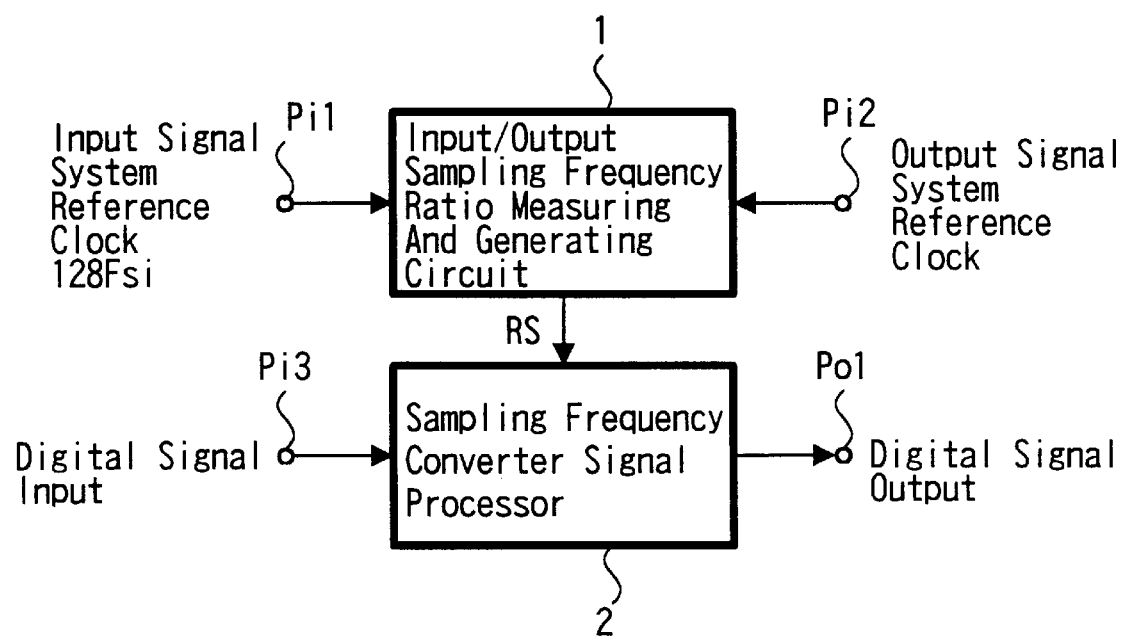
FIG. 1 is a block diagram showing a schematic configuration of a sampling frequency converting apparatus.
Figure 2:
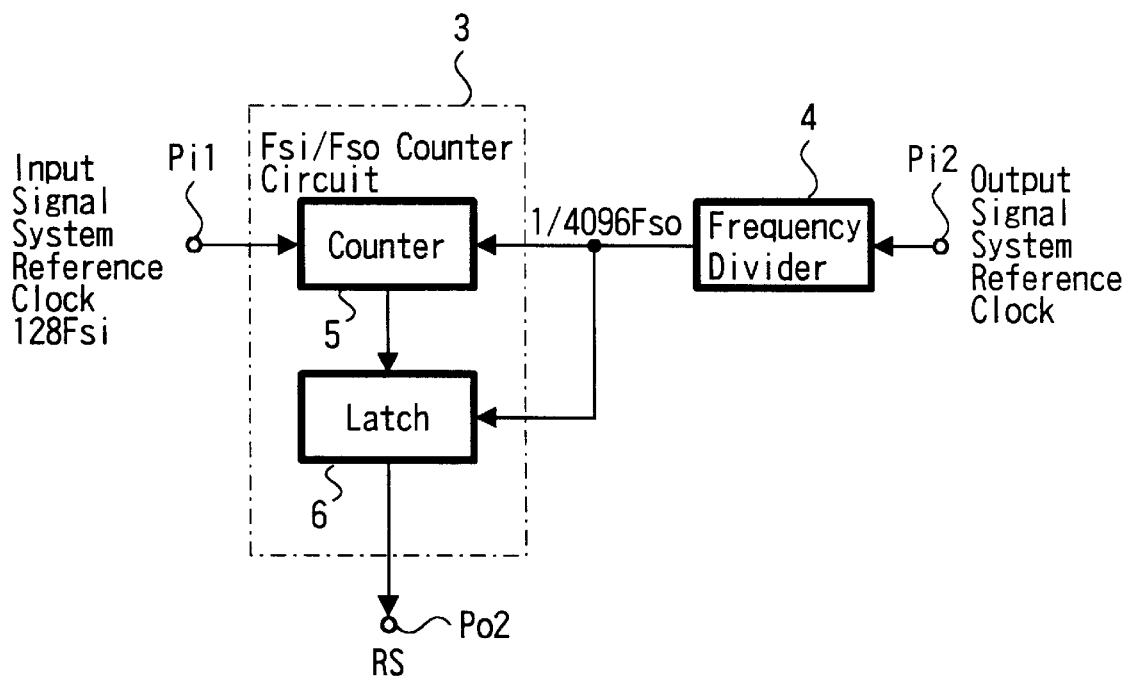
FIG. 2 is a block diagram showing an example of the structure of an input/output sampling frequency ratio measuring and generating circuit 1 in FIG. 1.
Figure 4:
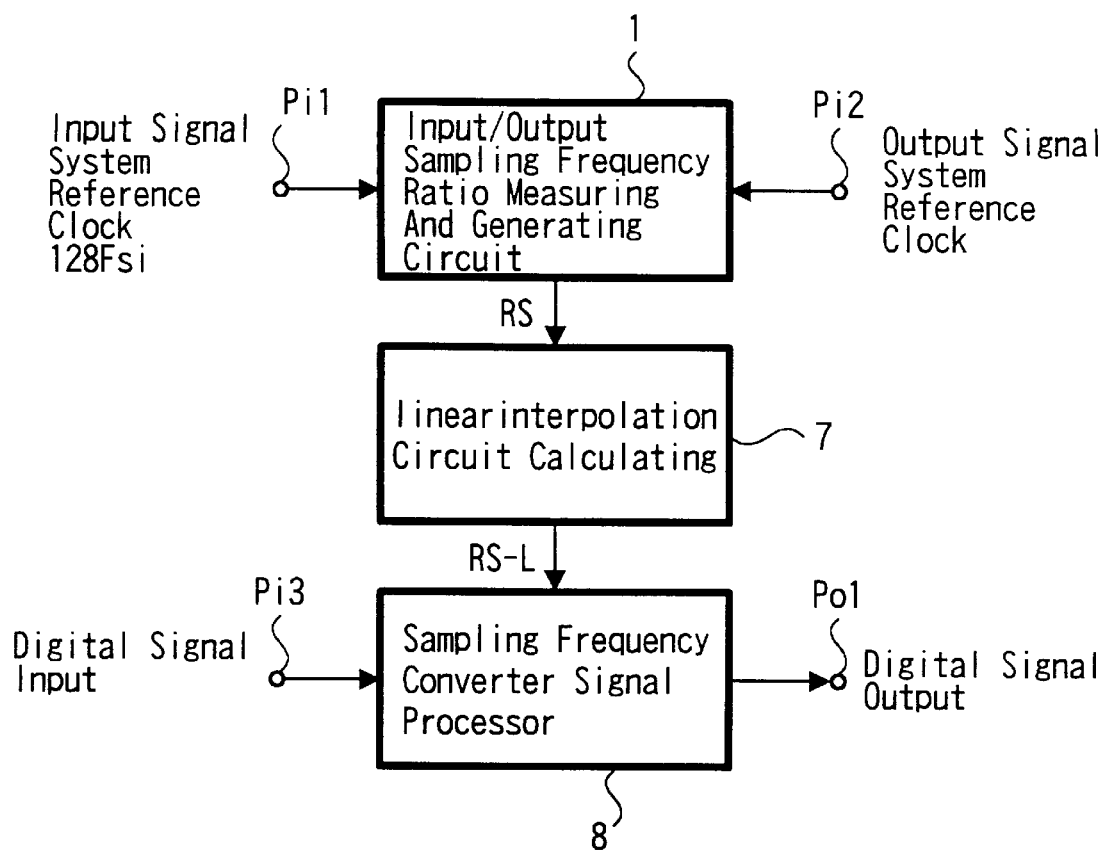
FIG. 4 is a block diagram showing a sampling frequency converting apparatus according to an embodiment of the present invention.

Embodiments according to the present invention will be described in detail below with reference to accompanying drawings. FIG. 4 shows an embodiment of the sampling frequency converting apparatus according to the present invention, in which like parts corresponding to those of FIG. 1 are denoted by the same reference numerals and their detailed description will be omitted. In this sampling frequency converting apparatus, the measured value RS of the input/output sampling frequency ratio from the input/output sampling frequency ratio measuring and generating circuit 1 is supplied to a linear interpolation operation circuit 7.

Figure 5:
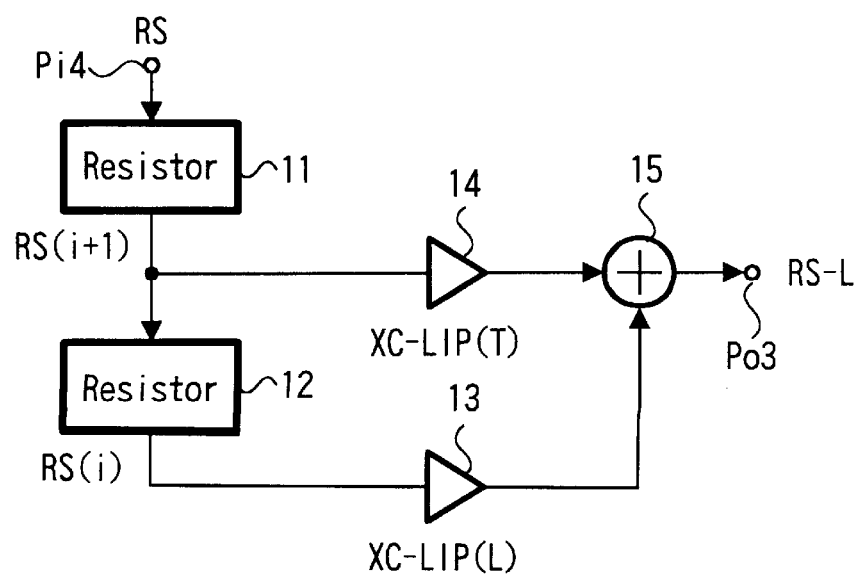
FIG. 5 is a block diagram showing an example of the structure of a linear interpolation operating circuit in FIG. 4.

The linear interpolation operation circuit 7 comprises, as is shown in FIG. 5 by way of example, registers 11 and 12 for sequentially transferring and holding the two measured values RS (i) and RS (i+1) of the input/output sampling frequency ratio supplied successively from the input/output sampling frequency ratio measuring and generating circuit 1 through an input terminal Pi4, a multiplier 13 for multiplying the previous measured value RS (i) held in the register 12 by a linear interpolation coefficient C-LIP (L) for a previous measured value which is a weighing coefficient of the linear interpolation, a multiplier 14 for multiplying the following measured value RS (i+1) held in the resistor 11 by a linear interpolation coefficient C-LIP (T) for a following measured value which is a weighing coefficient of the linear interpolation, and an adder 15 for adding outputs of the multipliers 13 and 14.

The linear interpolation coefficient C-LIP(L) for the previous measured value is the coefficient such that its initial value is one and its value decreases linearly as (n-1)/n, (n-2)/n, etc. at every processing period To of the sampling frequency conversion whose length is 1/n n is an integer equal to two or more) of the measuring period T of the input/output sampling frequency ratio, its final value going to zero when the period T has passed. Conversely, the linear interpolation coefficient C-LIP(T) for the following measured value is the coefficient such that its initial value is zero and its value increases linearly as 1/n, 2/n, etc. at every processing period To, its final value going to one when the period T has passed.

Figure 6:
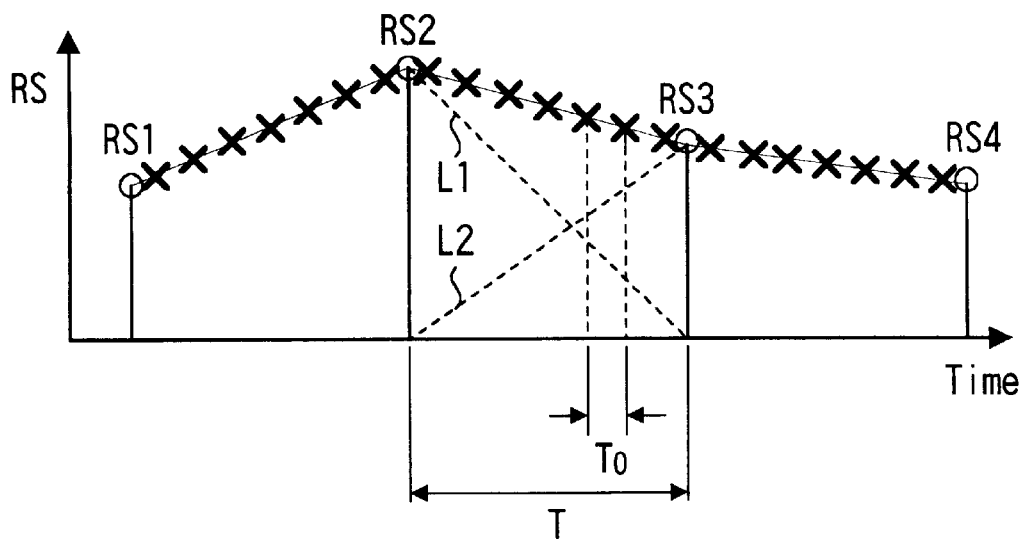
FIG. 6 is a diagram showing an example of the interpolation processing in the linear interpolation operating circuit shown in FIG. 4.

Accordingly, when measured values RS 2 and RS 3 of the input/output sampling frequency ratio, for example, as shown in FIG. 6, are held in the respective registers 11 and 12 as RS(i) and RS(i+1), since the multiplying results of the multiplier 13 and 14 will be positioned on dotted lines L1 and L2 in the figure respectively, the adding results of the adder 15 will be as indicated by X marks on a line joining RS2 and RS3. Likewise, when RS1 and RS2 in the Figure are RS(i) and RS(i+1) respectively, the adding results of the adder 15 will be as indicated by X marks on a line joining RS1 and RS2, and when RS 3 and RS4 in the Figure are RS(i) and RS(i+1) respectively, the adding results of the adder 15 will be as indicated by X marks on a line joining RS3 and RS4. In this way, linearly interpolated values RS-L of the input/output sampling frequency ratio in which each of the measured value RS of the input/output sampling frequency ratio is linearly interpolated by being divided into n equal parts are obtained. The time required for such an interpolation processing in the linear interpolation operation circuit 7 is much shorter as compared with the time required for sufficiently reducing the change of the measured value RS of the input/output sampling frequency ratio, for example, by the integration.

Figure 3:
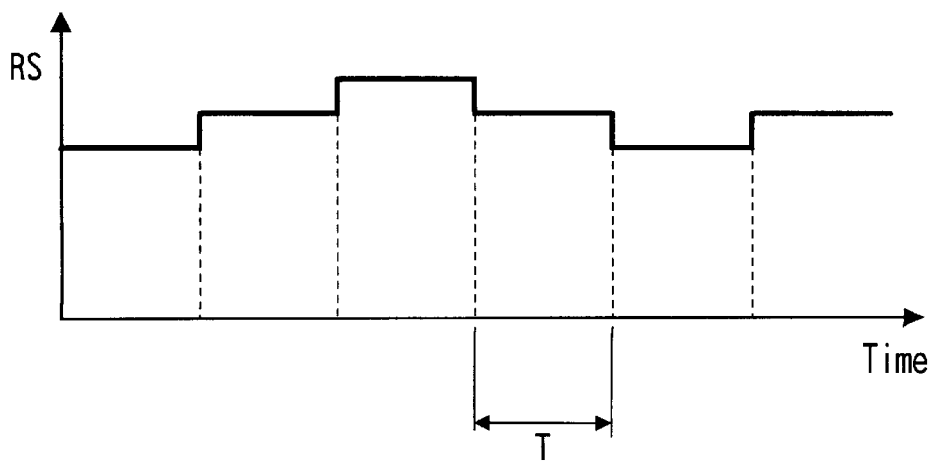
FIG. 3 is a diagram showing an example of a measured value RS of the input/output sampling frequency ratio.
Figure 7:
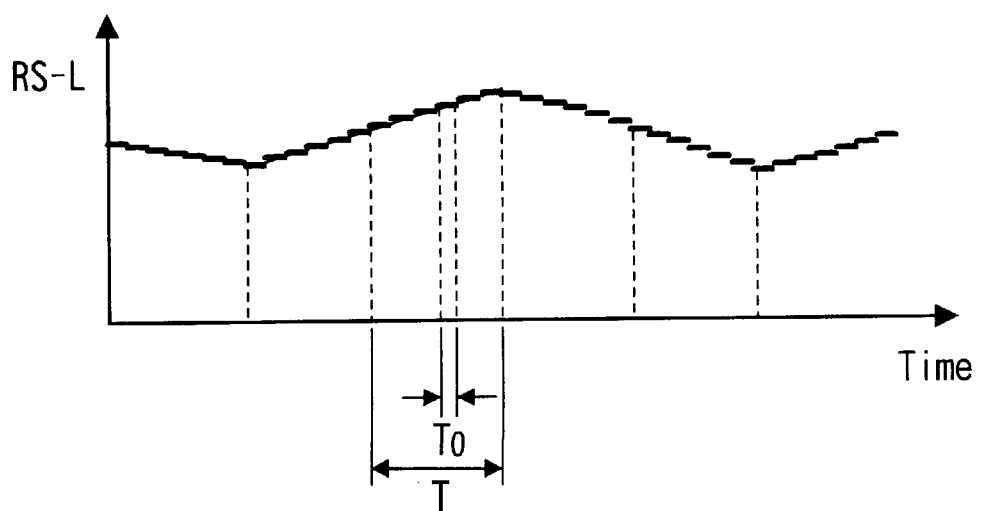
FIG. 7 is a diagram showing an example of the linear interpolated value RS-L of the input/output sampling frequency ratio.

FIG. 7 shows the linearly interpolated value RS–L of the input/output sampling frequency ratio which is obtained by linearly interpolating the measured value RS of the input/output sampling frequency ratio of FIG. 3 in the linearly interpolating operating circuit 7. It can be seen therefrom that the rapid change is sufficiently lowered as compared with the original measured value RS of the input/output sampling frequency ratio.

Further, concerning the coefficients C-LIP (L) and C-LIP (T), for example, a CPU (not shown) for controlling the entire sampling frequency converting apparatus may directly output and supply these coefficients to the multiplier 13 and 14, or the CPU may read out a coefficient memory storing these coefficients to supply them to the multiplier 13 and 14.

The linearly interpolated value RS–L of the input/output sampling frequency ratio is supplied to a sampling frequency converter signal processor 8 in FIG. 4 through an output terminal Po 3. The sampling frequency converter signal processor 8 converts the sampling frequency of the digital signal using the linearly interpolated value RS–L of the input/output sampling frequency ratio from the input sampling frequency Fsi to the output sampling frequency Fso.

Figure 8:
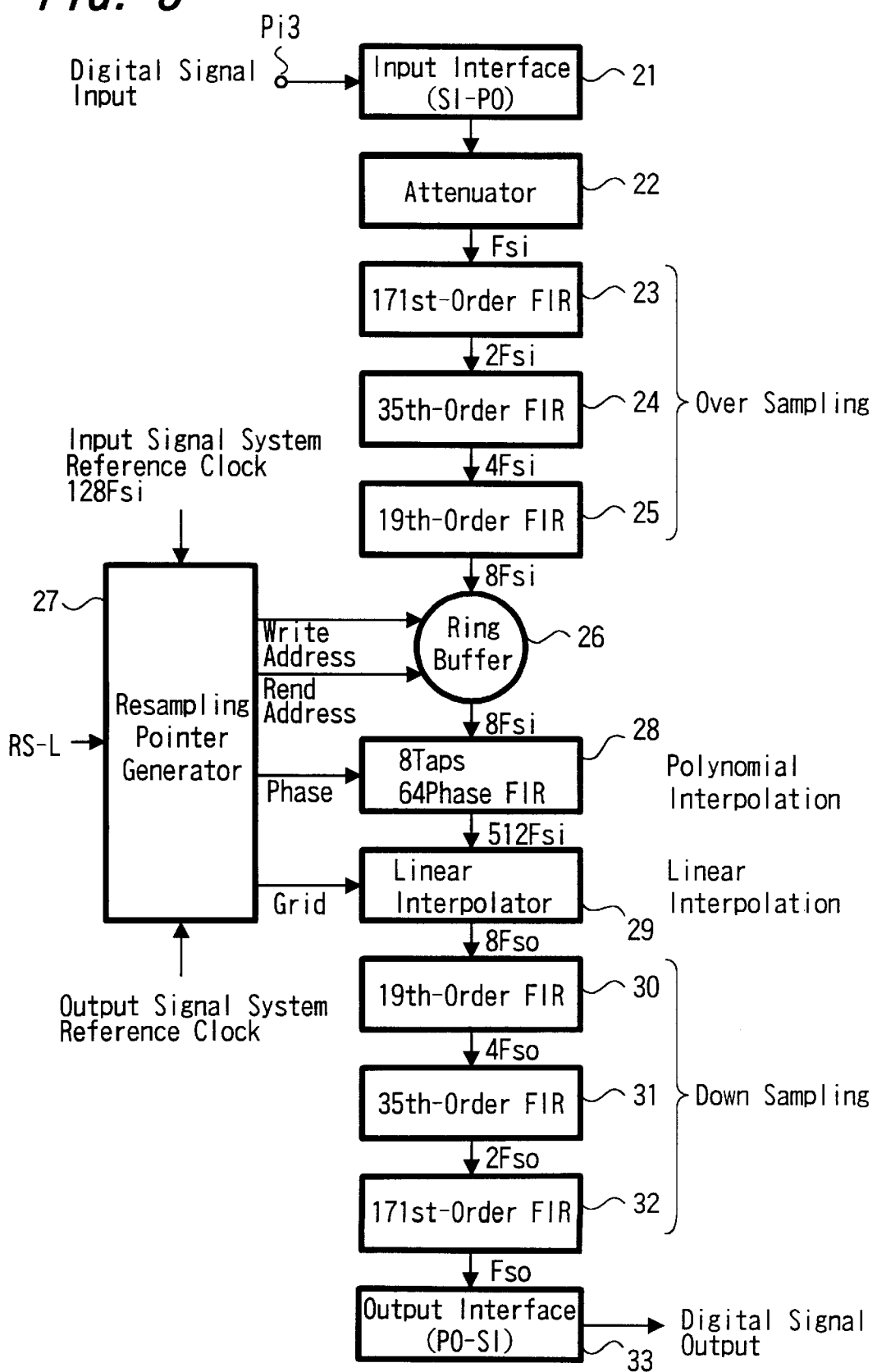
FIG. 8 is a diagram showing an example of the signal processing in the sampling frequency converter signal processor shown in FIG. 4.

FIG. 8 shows a signal processing in the sampling frequency converter signal processor 8 as a time sequence. The digital signal of the sampling frequency Fsi supplied from the transmitting side digital equipment through the input terminal Pi3 as a serial signal is converted into a parallel signal by an input interface (SI–PO) 21 for serial to parallel conversion and is gradually attenuated by an attenuator 22. Thereafter, the resulting signal is oversampled by a plurality of filters for oversampling (e.g. 171st order finite impulse response digital filter (FIR filter) 23, 35th order FIR filter 24 and 19th order FIR filter 25) and is then supplied to a ring buffer memory 26 as eight times oversampled data.

Figure 9:
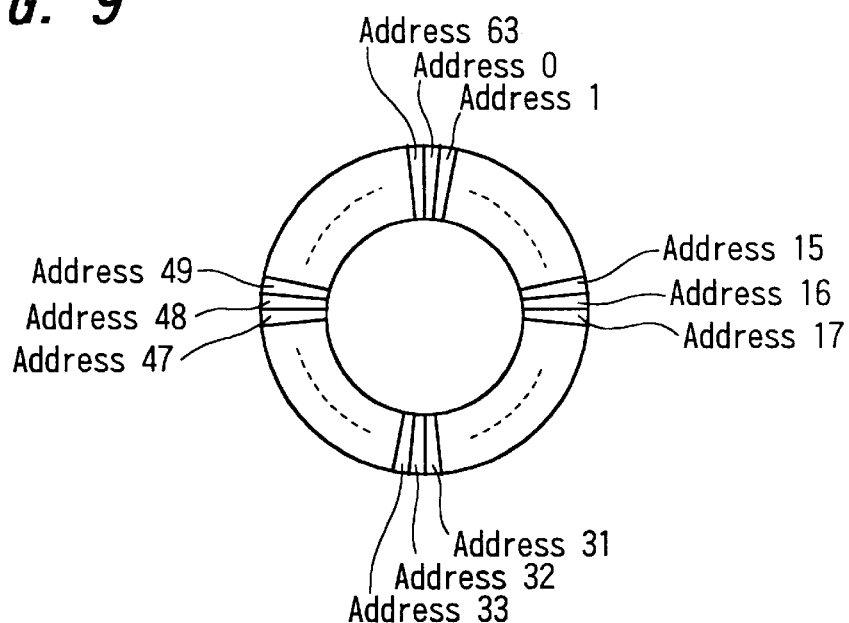
FIG. 9 is a diagram showing an example of the structure of a ring buffer memory shown in FIG. 8.

The ring buffer memory 26 has a storage capacity of, by way of example, sixty-four words (a capacity of storing the eight times oversampled data for 64 samples) and has sixty-four addresses 0~63 formed in a ring shape for storing each one sample, as shown in FIG. 9.

A resampling-pointer generator 27 receives the input signal system reference clock 128 Fsi as one of its input from the transmitting side digital equipment. The resampling-pointer generator 27 indicates repeatedly in sequence the addresses 0~63 of the ring buffer memory 26 as a write address based one clock of a frequency eight times the input sampling frequency Fsi. Consequently, the individual eight times oversampled data are sequentially written into the storage regions of the addresses 0~63.

Furthermore, the resampling-pointer generator 27 receives the linearly interpolated value RS–L of the input/output sampling frequency ratio from the linear interpolation operation circuit 7 as well as the output signal system reference clock from the receiving side digital equipment. The resampling-pointer generator 27 adds up the linearly interpolated value RS–L (as described above, since the counter 5 of the Fsi/Fso counter circuit 3 is of 19 bits word length, RS–L is also a value of 19 bits) of the input/output sampling frequency ratio from the linear interpolation operating circuit 7 at every each period of a clock of a frequency eight times the output sampling frequency Fso to calculate resampling address data of 24 bits.

In this regard, the measured value RS of the input/output sampling frequency ratio which is the origin of the linearly interpolated value RS–L of the input/output sampling frequency ratio is found by measuring the input signal system reference clock 128 Fsi (i.e. the clock of a frequency $16=2^4$ times the eight times oversampled data) over a time period $4096=2^{12}$ times the period of the output sampling frequency Fso. Therefore, a value $1/(2^4 \times 2^{12}) = 1/2^{16}$ times the resampling address data corresponds to one sample of the eight times oversampled data in the ring buffer memory 26. Thus, upper 6 bits rather than lower 18 bits of the resampling address data are used as a read address ($2^6=64$ addresses) of the ring buffer memory 26 and the lower 18 bits are used as data for the interpolation processing.

In this context, upper 6 bits of the 18 bits data for the interpolation processing are used as a read address (Phase address) of a coefficient ROM in a FIR filter 28 for the polynomial interpolation, whereas lower 12 bits thereof are used as a read address (Grid address) of 4096 interpolating coefficients of a linear interpolator 29 for a linear interpolation dividing into $4096=2^{12}$ equal parts. Further, the FIR filter 28 performs, by way of example, Lagrange's seventh order polynomial interpolation, in which the eight times oversampled data of eight samples which are the sum of preceding four samples and following four samples of a target output sample are employed, as is known. If the read address of the ring buffer memory 26 is assumed to indicate, for example, an address of the eight times oversampled data immediately prior to the target output sample, the eight times oversampled data of eight address which are the sum of that address and three addresses immediately prior thereto and four addresses immediately thereafter are sequentially read out from the ring buffer memory 26 based on these read addresses.

Concerning the FIR filter 28, the number of taps (the number of multipliers) is eight, by way of example, and its coefficient ROM stores the sixty-four interpolation coefficients in each section of eight samples (eight sections in total) of the eight times oversampled data (64×8=512 in total) these coefficients being divided into sixty-four groups each group of which includes eight interpolation coefficients whose divided position (phase) when the each section is divided into sixty-four parts is correspondent each other. The Phase address of six bits from the resampling-pointer generator 27 points any one group of the $64=2^6$ groups. The eight interpolation coefficients in that group are sequentially read out from the coefficient ROM based on the Phase address.

In the FIR filter 28, the eight interpolation coefficients at a divided position immediately prior to the target output sample is first read out of the coefficient ROM according to the Phase address. These eight interpolation coefficients and the eight samples of the eight times oversampled data read out of the ring buffer memory 26 are multiplied with each other in the respective multipliers, and outputs of the multipliers are added, thereby causing interpolating data X1 at the divided position immediately prior to the target output sample to be found. Next, the eight interpolation coefficients at a divided position immediately after the target output sample are read out of the coefficient ROM according to the Phase address. These eight interpolation coefficients and the eight samples of the eight times oversampled data read out of the ring buffer memory 26 are multiplied with each other in the respective multipliers, and outputs of the multipliers are added, thereby causing interpolating data X2 at the divided position immediately after the target output sample to be found.

In a linear interpolator 29, by multiplying together the interpolating data X1, X2 found by the FIR filter 28 and interpolating coefficients 1−α, α indicated by the Grid address from the resampling-pointer generator 27, interpolating data value (1−α)×1+α×2 of the target output sample is found.

Such processings are repeatedly performed at every period of the clock of the frequency eight times the output sampling frequency Fso, thereby making sample data 8 Fso of the frequency eight times the sampling frequency Fso to be obtained. The sampling frequency of the sample data 8 Fso is decreased by an FIR filter as a decimeter (e.g. 19th order FIR filter 30, 35th order an FIR filter 31 and 171st order FIR filter 32), thus allowing sample data Fso of the output sampling frequency Fso to be obtained. This sample data Fso is converted by an output interface (PO-IS) 33 for parallel to serial conversion into a serial signal which is transferred to the receiving side digital equipment through the output terminal Po1.

While the aforesaid signal processing in the sampling frequency converter signal processor 8 may be implemented by an exclusive hard ware circuit, it may also be implemented by making a micro-processor to execute a program describing such a signal processing.

As described above, since the linearly interpolated value RS−L of the input/output sampling frequency ratio is the value whose rapid change is sufficiently reduced, the sample data which is read out of the ring buffer memory 26 and interpolated based on the added value of RS−L will not involve such a temporal wave form distortion as is involved in the case where the sample data is read out and interpolated based on the measured value RS itself of the input/output sampling frequency ratio. Therefore, the deterioration of the frequency converting accuracy resulting from the change of the measured value RS of the input/output sampling frequency ratio will be prevented. In a result of an experiment in which the linear interpolation operating circuit 7 shown in FIG. 4 was actually used, a converting error was restricted within 20 bits so that a high accuracy of frequency conversion was able to be implemented.

Moreover, as described above, the time required for interpolation processing in the linear interpolation operating circuit 7 is extremely short. As the result of the above experiment, there occurred almost no time lapse in supplying the linearly interpolated value RS−L of the input/output sampling frequency ratio from the linear interpolation operating circuit 7 to the sampling frequency converter signal processor 8. Therefore, the real-time requirement of the conversion processing in the sampling frequency converting apparatus is sufficiently satisfied.

By the way, while, in this embodiment, the linear interpolation operating circuit 7 which linearly interpolates the measured value RS of the input/output sampling frequency ratio is provided, an interpolation operating circuit which performs the polynomial interpolation of the measured value RS of the input/output sampling frequency ratio may be provided in place of the linear interpolation operating circuit.

In addition, while in this embodiment the ring buffer memory 26 is provided in the sampling frequency converter signal processor 8 for temporarily storing the digital signals in the middle of the frequency conversion, a buffer memory other than the ring buffer memory may be provided to temporarily store the digital signals.

Figure 10:
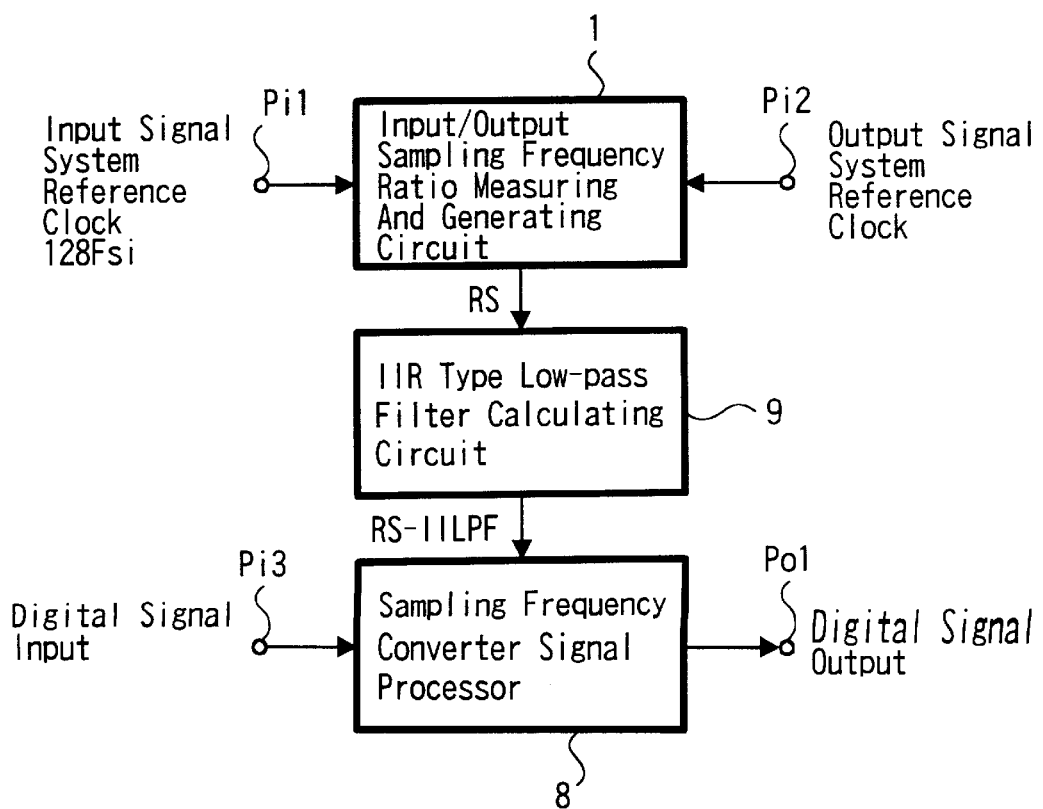
FIG. 10 is a block diagram showing a sampling frequency converting apparatus according to another embodiment of the present invention.

Next, FIG. 10 shows another embodiment of the sampling frequency converting apparatus, in which figure parts corresponding to those of FIG. 4 and FIG. 5 are denoted by the same reference numerals thus allowing their detailed description to be omitted. In this sampling frequency converting apparatus, the measured value RS of the input/output sampling frequency ratio from the input/output sampling frequency ratio measuring and generating circuit 1 is supplied to an infinite impulse response (IIR) type low pass filter operating circuit 9.

Figure 11:
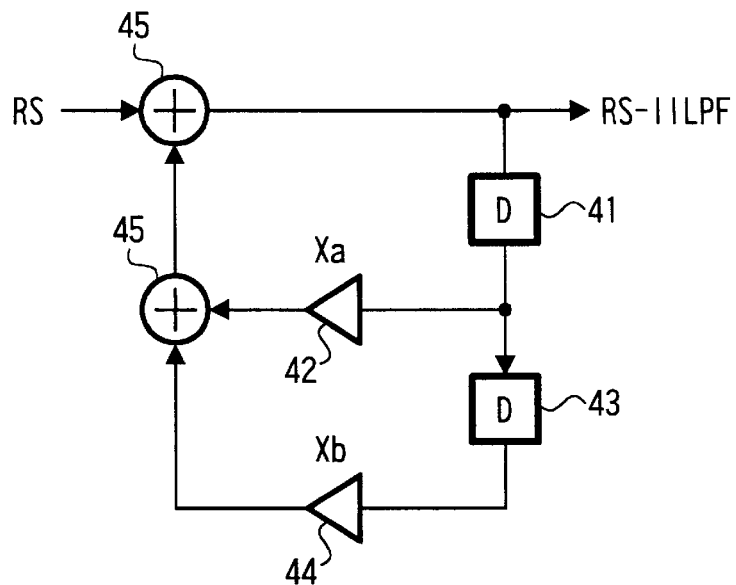
FIG. 11 is a block diagram showing an example of the structure of an IIR type low pass filter operating circuit shown in FIG. 10.

The IIR type low pass filter operating circuit 9 is comprised of, by way of example, a second order IIR filter as shown in FIG. 11, in which the each measured value RS(i) of the input/output sampling frequency ratio, a value a·RS(i−1) of the input/output sampling frequency ratio one measuring period before which is multiplied by a filter coefficient a in a multiplier 42 through a delay element 41 (the delay time=the measuring period T) and a value b·RS(i−2) of the input/output sampling frequency ratio two measuring periods before which is multiplied by a filter coefficient b in a multiplier 44 through the delay elements 41 and 43 (the delay time=the measuring period T) are added together in adders 45 and 46.

Since a high frequency component of the measured value RS of the input/output sampling frequency ratio is removed by performing such a circulating multiplicative and additive operation, a measured value of the input/output sampling frequency ratio RS−IILPF in which an amount of change is sufficiently reduced can be obtained. As shown in FIG. 10, this measured value RS−IILPF of the input/output sampling frequency ratio is supplied to the sampling frequency converting signal processor 8. In the sample frequency converter signal processor 8, the frequency conversion of the digital signal is performed by executing the signal processing as shown in FIG. 8 using the measured value RS−IILPF of the input/output sampling frequency ratio.

Further, even if the time delays of the delay elements 41 and 43 may be other than T (e.g. a time shorter than T such as ½T or ¼T), it is also possible to obtain the measured value RS−IILPF of the input/output sampling frequency ratio in which the amount of change is sufficiently reduced.

In addition, the IIR filter whose order is other than the second order may of course be employed as the IIR type low pass filter operating circuit 9.

Figure 12:
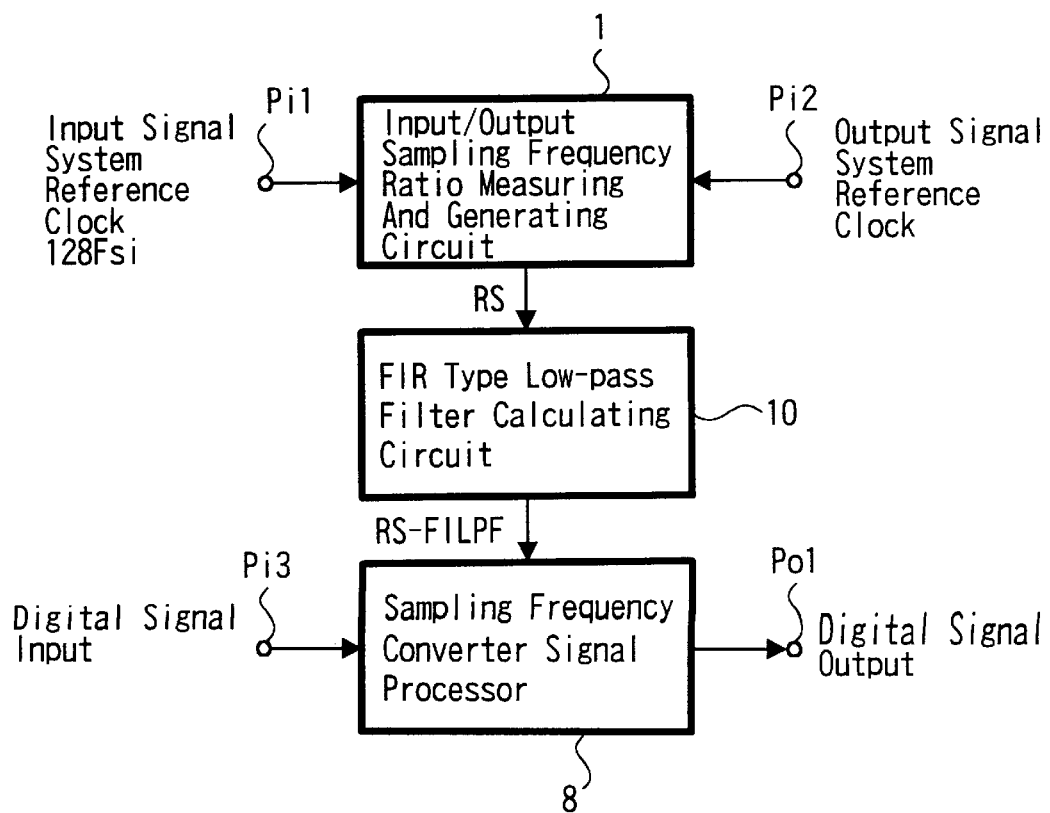
FIG. 12 is a diagram showing a sampling frequency converting apparatus according to a still another embodiment of the present invention.

Next, FIG. 12 shows a still another embodiment of the sampling frequency converting apparatus, in which figure parts corresponding to those of FIG. 4 and FIG. 5 are denoted by the same reference numerals thus allowing its detailed description to be omitted. In this sampling frequency converting apparatus, the measured value RS of the input/output sampling frequency ratio from the input/output sampling frequency ratio measuring and generating circuit 1 is supplied to a FIR type low pass filter operating circuit 10.

Figure 13:
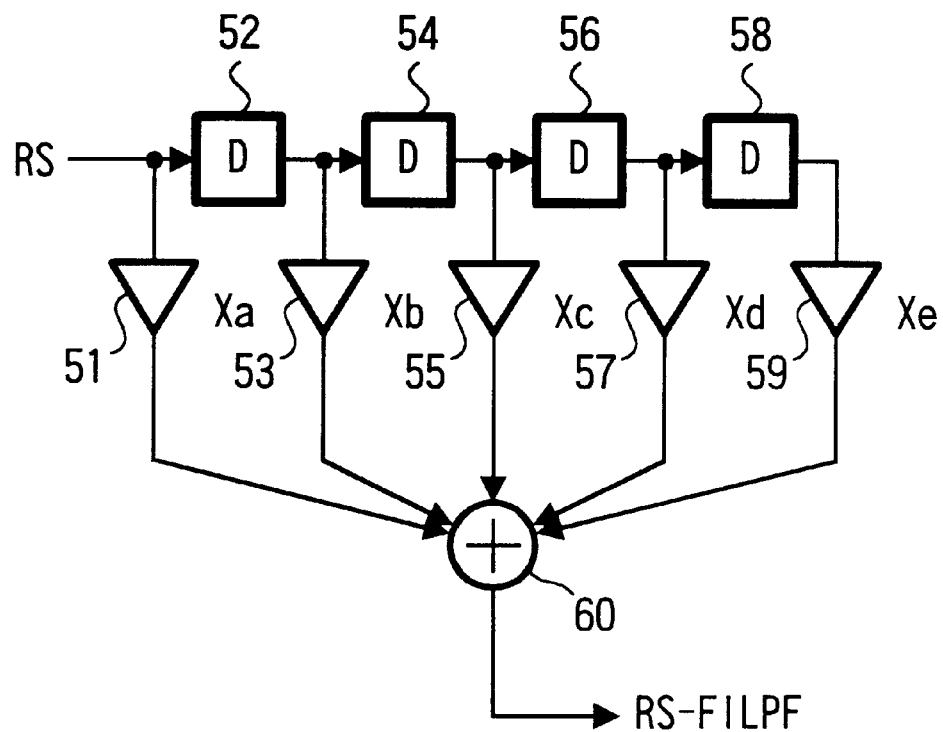
FIG. 13 is a block diagram showing an example of the structure of an FIR type low pass filter operating circuit shown in FIG. 12.

The FIR type low pass filter operating circuit 10 is comprised of, by way of example, a fourth order FIR filter as shown in FIG. 13, in which each value a·RS(i) of the input/output sampling frequency ratio which is multiplied by a filter coefficient a in a multiplier 51, a value b·RS(i−1) of the input/output sampling frequency ratio one measuring period before which is multiplied by a filter coefficient b in a multiplier 53 through a delay element 52 (the delay time=the measuring period T), a value c·RS(i−2) of the input/output sampling frequency ratio two measuring periods before which is multiplied by a filter coefficient C in a multiplier 55 through delay elements 52 and 54 (the delay time=the measuring period T), a value d·RS(i−3) of the input/output sampling frequency ratio three measuring periods before which is multiplied by a filter coefficient d in a multiplier 57 through delay elements 52, 54 and 56 (the delay time=the measuring period T), and a value e·RS(i−4) of the input/output sampling frequency ratio four measuring periods before which is multiplied by a filter coefficient e in a multiplier 59 through delay elements 52, 54, 56 and 58 (the delay time=the measuring period T) are added together (in the figure, the adding means is represented by a single adder 60 for convenience' sake).

Since a high frequency component of the measured value RS of the input/output sampling frequency ratio is removed by performing such a multiplicative and additive operation, a measured value RS−FILPF of the input/output sampling frequency ratio in which an amount of change is sufficiently reduced can be obtained. As shown in FIG. 12, this measured value RS−FILPF of the input/output sampling frequency ratio is supplied to the sampling frequency converter signal processor 8. In the sampling frequency converter signal processor 8, the frequency of the digital signal is converted by executing the signal processing as shown in FIG. 8 using the measured value RS−FILPF of the input/output sampling frequency ratio.

Further, in the FIR filter of FIG. 12, by setting all the filter coefficients a, b, c, d, e to be 1/N (where N is a number of taps (multipliers) and five in this case), a moving average operating circuit may be formed. According to such a moving average operating circuit, a measured value RS−IILPF of the input/output sampling frequency ratio in which an amount of change of the input/output sampling frequency ratio is lowered to 1/N can be acquired.

Moreover, a FIR filter whose order is other than the fourth order may of course be employed as the FIR type low pass filter operating circuit 10.

In addition, it goes without saying that the present invention is not limited to the aforesaid embodiments and can take other various modifications without departing from the scope of the present invention.

As described above, according to the sampling frequency converting apparatus of the present invention, even if the measured value RS of the input/output sampling frequency ratio may change due to the input sampling frequency Fsi (or the output sampling frequency Fso) being variable in the middle of the processing of sampling frequency conversion, it is possible to prevent the deterioration of the converting accuracy resulting therefrom for implementing a high accuracy of the frequency conversion, and further, to make the real-time requirements in the sampling frequency converting apparatus to sufficiently be satisfied, which are advantageous effects of the present invention.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A sampling frequency converting apparatus for converting an input first digital signal having an input sampling frequency Fsi (Hz) into a second digital signal having a variable output sampling frequency Fso (Hz), comprising:

input signal system reference clock signal generating means for generating a clock signal having a frequency of N×Fsi (Hz) which is N times (N is a positive integer) as high as said input sampling frequency Fsi (Hz);

output signal system reference clock signal generating means for generating a clock signal having said variable sampling frequency Fso (Hz);

input/output sampling frequency ratio measuring means for determining a ratio of said input sampling frequency Fsi (Hz) to said variable sampling frequency Fso (Hz);

linear interpolation means for linearly interpolating at a regular time interval said ratio determined by said input/output sampling frequency ratio measuring means;

over-sampling means for oversampling said first digital signal having said input sampling frequency Fsi (Hz);

storage means for temporarily storing said over-sampled first digital signal supplied from said over-sampling means;

address generating means for generating a read address for said over-sampled first digital signal stored in said storage means based on a linear interpolation value of said ratio output from said linear interpolation means; and converting means for reading out said over-sampled first digital signal from said storage means based on said read address generated by said address generating means and converting said over-sampled first digital signal into said second digital signal having said variable output sampling frequency Fso (Hz).

2. A sampling frequency converting apparatus according to claim 1, wherein said linear interpolation means includes an infinite impulse response filter.

3. A sampling frequency converting apparatus according to claim 1, wherein said linear interpolation means includes a finite impulse response filter.

4. A sampling frequency converting apparatus according to claim 1, wherein said address generating means multiplies said linear interpolation value linearly interpolated from said ratio by said linear interpolation means with said second digital signal having said variable output sampling frequency Fso (Hz) to generate a multi-bit re-sampling address.

5. A sampling frequency converting apparatus according to claim 4, further comprising a digital filter for carrying out a polynomial interpolation, wherein high-order bits of said multi-bit re-sampling address are employed as a read address used for reading a coefficient of said digital filter for carrying out the polynomial interpolation.

6. A sampling frequency converting apparatus according to claim 4, wherein low-order bits of said multi-bit re-sampling address are employed as a read address used for reading an interpolation coefficient used by said linear interpolation means for carrying out a linear interpolation.

* * * * *